United States Patent
Hase

(10) Patent No.: US 6,863,726 B2
(45) Date of Patent: Mar. 8, 2005

(54) VAPOR PHASE GROWTH METHOD OF OXIDE DIELECTRIC FILM

(75) Inventor: Takashi Hase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 128 days.

(21) Appl. No.: 10/419,822

(22) Filed: Apr. 22, 2003

(65) Prior Publication Data

US 2003/0200916 A1 Oct. 30, 2003

(30) Foreign Application Priority Data

Apr. 24, 2002 (JP) ........................................ 2002-122221

(51) Int. Cl.⁷ .............................................. C30B 25/02
(52) U.S. Cl. ........................... 117/89; 117/93; 117/102; 117/105
(58) Field of Search ............................. 117/84, 89, 93, 117/102, 105

(56) References Cited

FOREIGN PATENT DOCUMENTS

JP        2000-58525 A    *    2/2000

OTHER PUBLICATIONS

T. Watanabe et al., "Orientation Control of Metalorganic Chemical Vapor Deposition $Bi_4Ti_3O_{12}$ Thin Film by Sequential Source Gas Supply Method", Japanese Journal of Applied Physics, vol. 39, No. 9A, Part 1, (Sep. 2000), pp. 5211–5216.*

Y. Sotome et al., "c–Axis–Oriented $Pb(Zr, Ti)O_3$ Thin Films Prepared by Digital Metalorganic Chemical Vapor Deposition Method", Japanese Journal of Applied Physics, vol. 33, No. 7A, Part 1, (Jul. 1994), pp. 4066–4069.*

* cited by examiner

*Primary Examiner*—Felisa Hiteshew
(74) *Attorney, Agent, or Firm*—Sughrue Mion, PLLC

(57) ABSTRACT

A vapor phase growth method of an oxide dielectric film for forming an oxide dielectric film having a perovskite crystal structure expressed by $ABO_3$ on a substrate according to the present invention includes a first step of sequentially and alternately supplying an A-site layer element material and a B-site layer element material to grow an atomic layer on the substrate to form an early layer or early core, at a first substrate temperature, and a second step of raising the temperature to a second substrate temperature that is higher than the first substrate temperature to crystallize the early layer or early core formed in the first step and simultaneously supplying both the A-site layer element material and the B-site layer element material to form an $ABO_3$ film.

10 Claims, 3 Drawing Sheets

VAPOR PHASE GROWTH METHOD OF OXIDE DIELECTRIC FILM

BACKGROUND OF THE INVENTION

1. Field of the Invention

The present invention relates to a vapor phase growth method of an oxide dielectric film, in particular, a vapor phase growth method of an oxide dielectric film having a perovskite crystal structure.

2. Description of the Prior Art

In recent years, ferroelectric memories (FeRAM) are studied which utilizes ferroelectric films as a capacitance insulating film. The ferroelectric memory is a nonvolatile memory utilizing the characteristics of a ferroelectric film whose polarization is maintained after voltage is applied. The properties required for the ferroelectric film include large residual polarization, a low polarization writing voltage, the uniformity of polarization properties in the element size of an order of 1 $\mu$m or less, and a low deposition temperature for achieving these properties.

Japanese Patent Laid-Open No. 2000-58525 describes the deposition method by CVD method of the perovskite ferroelectric film which is required to have these properties. The method includes first forming an early core or early layer in a first condition and then performing deposition by changing the conditions such as the supply quantity of a source gas containing a metalorganic material gas from the first condition to a second condition while maintaining the temperature. In accordance with the method, it is possible to deposit a perovskite ferroelectric film at a temperature of approximately 450° C. or less on an electrode of a metal such as Pt, Ru or Ir, or of a conductive oxide such as $RuO_2$ or $IrO_2$. Thus, it is also possible to form a ferroelectric film on the semiconductor substrate to which wiring of aluminum or the like is already formed.

In addition, as ferroelectrics have the anisotropy of polarization in the crystal axis direction, the control of orientation is needed for the uniformity of the polarization properties, and an attempt to control the orientation has been made by stacking atomic layers during the growth of a crystal. Such a method is indicated to have an effect to lower the temperature required for the crystallization. For example, for CVD method, "c-Axis-Oriented Pb(Zr,Ti) $O_3$ Thin Films Prepared by Digital Metalorganic Chemical Vapor Deposition Method" by Y. Sotome et al. in Japanese Journal of Applied Physics Vol. 33 (1994) pp. 4066–4069 reports that c-axis-oriented lead zirconate titanate (Pb(Zr,Ti) $O_3$, hereinafter referred to as "PZT") can be prepared at 480° C. on a MgO single crystal substrate by repeating the operation of sequentially supplying a Ti source gas, a Pb source gas and a Zr source gas with amounts corresponding to the respective one atomic layer. In addition, "Orientation Control of Metalorganic Chemical Vapor Deposition-$Bi_4Ti_3O_{12}$ Thin Film by Sequential Source Gas Supply Method" by T. Watanabe et al. in Japanese Journal of Applied Physics Vol. 39 (2000) pp. 5211–5216 reports that c-axis-oriented bismuth titanate ($Bi_4Ti_3O_{12}$, BIT) can be prepared at 500° C. on a polycrystalline platinum electrode by controlling the order for supplying a Bi source and a Ti source to be supplied with amounts corresponding to one atomic layer.

Conventional methods however have disadvantages as described below. First, the method described in Japanese Patent Laid-Open No. 2000-58525 may produce defective cells due to the variations of the properties of capacitance elements, when memory cells having the capacitance elements of a minute size are highly integrated. This is because, as the size of the capacitance elements has become finer, the number of crystal grains in the ferroelectric film contained in one capacitance element is reduced, thereby enhancing the influence of one crystal grain having different properties.

On the other hand, the atomic layer deposition generally has a very low deposition speed. On the assumption that it takes five seconds to deposit one atomic layer, and about the same purging time is required between the deposition of atomic layers of different elements since oxide ferroelectrics include two elements or more as the, constitutional elements besides oxygen in almost all cases, about 20 seconds are required for preparing one crystal lattice with two elements. As 200 layers or more of unit lattices are required for preparing the ferroelectric having a film thickness of 100 nm, it takes 20×200=4000 seconds, that is, more than one hour. In addition, at a deposition temperature of approximately 500° C., migration between the deposited atomic layers due to the heat of substrates may occur thereby growing crystal grains larger, resulting in increased variations between elements as the size of the elements is reduced. By the same reason, solid phase reaction between the deposited atomic layers may easily occur thereby preventing sufficiently achieving the effect of the individual deposition of the atomic layers. Further, the CVD method does not necessarily produce the crystal growth surface parallel to the substrate, so that the effect for performing the atomic layer deposition cannot be sufficiently achieved.

BRIEF SUMMARY OF THE INVENTION

Summary of the Invention

A vapor phase growth method of an oxide dielectric film for forming an oxide dielectric film having a perovskite crystal structure expressed by $ABO_3$ on a substrate according to the present invention comprises a first step of sequentially and alternately supplying an A-site layer element material and a B-site layer element material to perform atomic layer deposition on the substrate to form an early layer or early core, at a first substrate temperature, and a second step of raising the temperature to a second substrate temperature that is higher than the first substrate temperature to crystallize the early layer or early core formed in the first step and simultaneously supplying both the A-site layer element material and the B-site layer element material to form an $ABO_3$ film.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
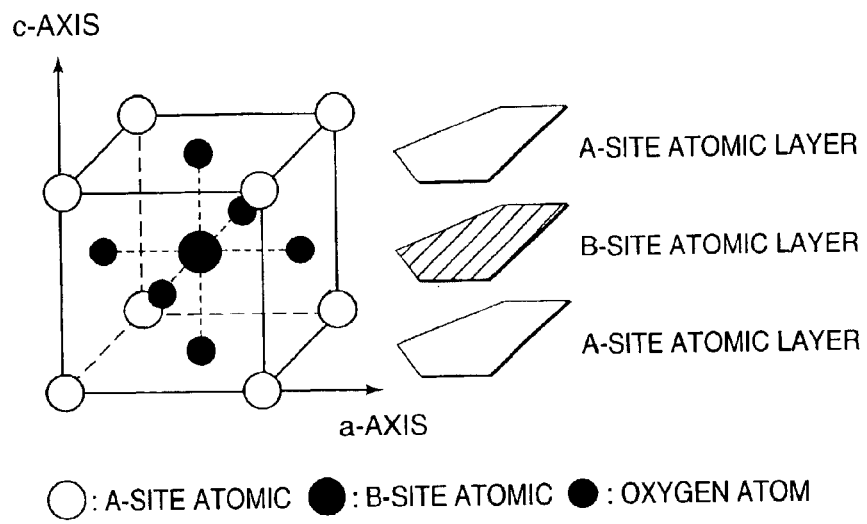
FIG. 1 schematically illustrates a unit lattice of a perovskite oxide ferroelectric.
Figure 2:
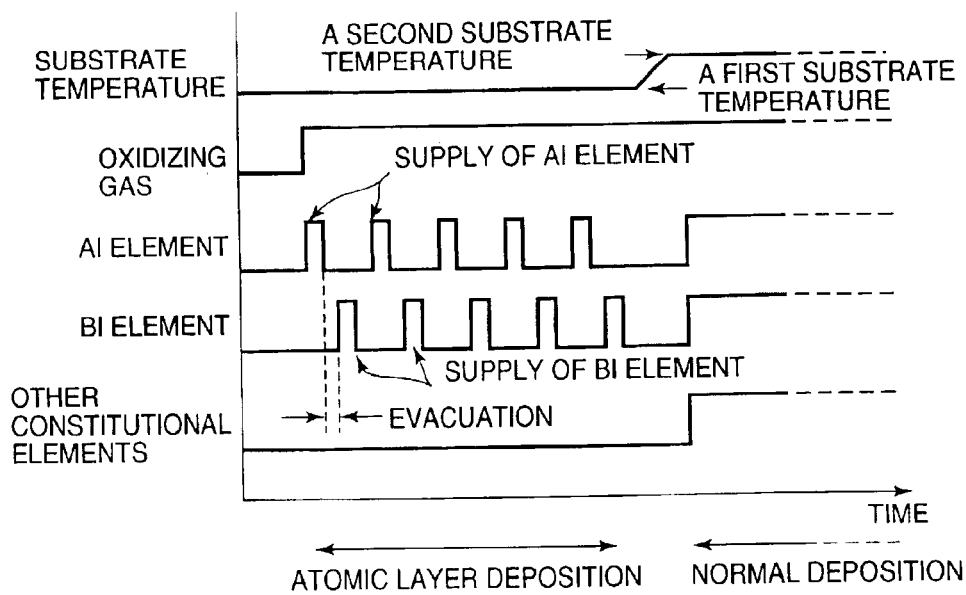
FIG. 2 illustrates a flow of deposition according to the present invention.

As shown in FIG. 1, a perovskite oxide dielectric which is a-axis or c-axis oriented has a structure in which the element contained in an A-site and the element contained in a B-site are alternately stacked. It shows that a perovskite oxide dielectric film which is a-axis or c-axis oriented can be formed by alternately depositing one atomic layer of the A-site element and one atomic layer of the B-site element. According to the present invention, as shown in the process flow of FIG. 2, the atomic layer deposition is applied only to the step of forming an early layer or early core to form the early layer or early core which is a-axis or c-axis oriented, and after that normal crystal growth is performed to obtain a perovskite oxide ferroelectric thin film which has inherited the orientation of the early layer or early core. Note that here the early layer denotes a state where an early-deposited film forms a continuous layer and the early core denotes a state where it is scattered in island form.

At this time, the conditions are arranged such that the temperature to deposit the early layer or early core is first set at a temperature where the crystallization does not occur, and then the temperature is raised to crystallize the early layer or early core, followed by normal crystal growth. Thus, the aforementioned effect can be achieved. The use of such a method allows deposition in a short time of a perovskite oxide ferroelectric which is a-axis or c-axis-oriented having small variations in properties. In addition, the present invention provides a method for forming the early layer or early core before depositing the target ferroelectric, and the crystallization of the early layer or early core is remarkably improved by performing the atomic layer deposition in this process, thereby allowing reduction of the deposition temperature of the target perovskite ferroelectric.

The examples of the present invention will now be described referring to the drawings together with comparison examples. Hereinafter, Pb(Zr0.37Ti0.63)O₃ (hereinafter as "PZT") is used as a perovskite oxide ferroelectric expressed by ABO₃; PbTiO₃ (hereinafter as "PTO") is used as an early layer or early core expressed by A1B1O₃; and a silicon oxide film is formed on a silicon substrate, and then Ti (20 nm), TiN (50 nm), Ti (20 nm) and Ru (100 nm) are sequentially prepared on the silicon oxide film by a sputtering method, the resultant product being used as a substrate for forming the early core. Note that Ti, TiN and Ru are all polycrystalline films. The early layer or early core and PZT were prepared by an MOCVD method. As source gases, lead bis(dipyvaloyl)methanate (Pb(DPM)₂), titanium isopropoxide (Ti(O-iPr)₄) and zirconium butoxide (Zr(O-tBu)₄) were used. They were heated for gasifying to 180° C., 80° C. and 85° C. respectively, transported to a deposition chamber through a heated massflow controller and piping without using carrier gas and supplied onto the surface of the substrate from a showerhead heated to 200° C. NO₂ was used as an oxidizing gas and similarly supplied from the showerhead, in which the source gases and NO₂ are separated so that they are not mixed. The pressure in the deposition chamber was controlled at 6.7 Pa.

At first, it was verified in advance that one atomic layer of a Pb—O layer, an A-site atomic layer, could be achieved by supplying a Pb source gas at 0.18 sccm for four seconds, and one atomic layer of a Ti—O layer, a B-site atomic layer, could be achieved by supplying a Ti source gas at 0.24 sccm for three seconds, at a substrate temperature of 360° C. in the conditions of the apparatus described in the present examples. The substrate temperature is set at 360° C., and the substrate is transported into the deposition chamber, followed by supplying the Pb source gas at 0.18 sccm for 20 seconds. Then, the atomic layer deposition step of the Ti source gas at 0.24 sccm for three seconds→deposition chamber evacuation for 10 seconds→the Pb source gas at 0.18 sccm for four seconds→deposition chamber evacuation for 10 seconds was repeated five times, preparing five layers of the PTO unit lattice. Subsequently, the temperature of the substrate was raised to 460° C. in the deposition chamber, and then each of the source gases, Pb, Zr and Ti, was simultaneously supplied at 0.18 sccm, 0.15 sccm and 0.14 sccm respectively, depositing PZT to a thickness of 230 nm. NO₂ gas, an oxidizing gas, was supplied at 20 sccm in all steps.

Figure 3:
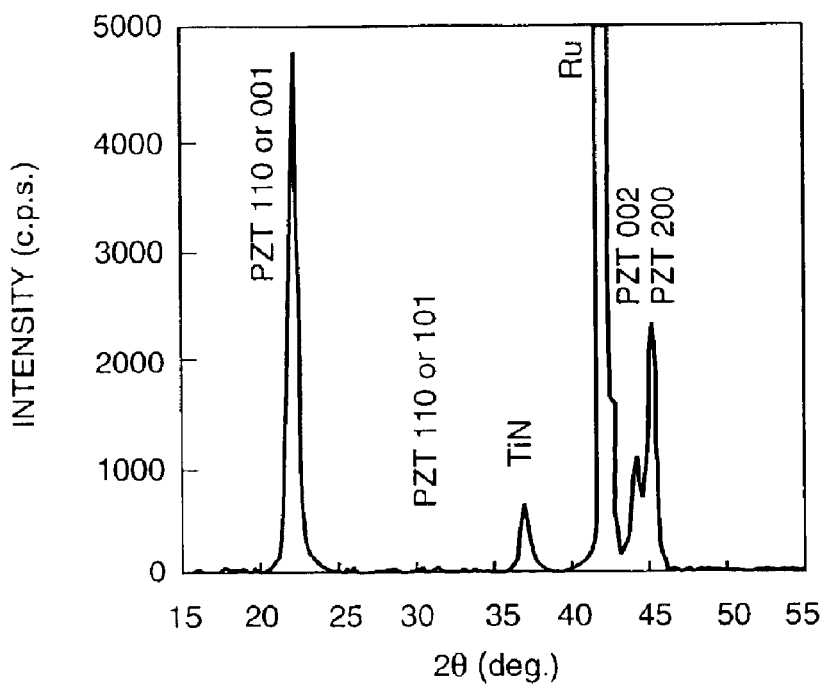
FIG. 3 illustrates an X-ray diffraction spectrum of a PZT thin film according to the present invention.

The XRD (X-ray diffraction) spectrum of the resultant thin film is shown in FIG. 3. The peak corresponding to (100) and (001) planes of PZT, which is of a tetragon, was intensely observed while the peak for (110) or (101) was the only peak derived from PZT showing other orientations. The intensity ratio of the peak intensity corresponding to (100) and (001) planes to the peak intensity corresponding to (110) or (101) plane was 52.9. As the similar intensity ratio for PZT in powder form is about 0.2, it is considered that the thin film is substantially 100% oriented in (100) and (001) planes.

A Ru film of 100 μm square was prepared on the thin film to prepare a parallel-plate capacitor between the Ru under PZT, and the polarization inversion charge (Psw) and the polarization non-inversion charge (Pnsw) were measured. It was found that Psw=42.4 μC/cm² and Pnsw=14.3 μC/cm², and the value corresponding to twice the residual polarization showing ferroelectricity was Psw-Pnsw=28.1 μC/cm². Good ferroelectricity has been achieved even at 460° C. that is very low as the deposition temperature of PZT.

In order to study the dependence of the atomic layer deposition step in the present examples on Pb supply time and Ti supply time, only the Pb supply time and the Ti supply time were changed to deposit PZT and measure the residual polarization. The results are shown in Table 1.

TABLE 1

| Pb supply time (seconds) | Ti supply time (seconds) | XRC intensity ratio | Psw-Pnsw (μc/cm²) |
|---|---|---|---|
| 3 | 3 | 16.9 | 26.8 |
| 5 | 3 | 21.5 | 26.9 |
| 4 | 2 | 10.0 | 19.2 |
| 4 | 4 | 10.0 | 23.0 |
| 4 | 3 | 52.9 | 28.1 |

The deviation of the supply time of Pb and Ti from the time corresponding to one atomic layer reduces the XRD intensity ratio, showing that the control of orientation by the atomic layer deposition is prevented. In the case the Pb supply time is longer than that corresponding to one atomic layer, however, the extent of the reduction of the intensity ratio is small, and the extent of the reduction of the value corresponding to twice the residual polarization value is small. This is due to the fact that as Pb has a high vapor pressure, some of the excessively supplied Pb atoms may re-evaporate into the vapor phase. Therefore, at the set temperature of 360° C., the supply time of Pb atoms does not require closer control compared to that of Ti. However, the supply time needs to be closely controlled in the case the atomic layer deposition is performed in a low temperature region where the re-evaporation of Pb atoms is reduced, or in the case the elements having a low vapor pressure such as Sr or Ba are contained in the early layer or early core.

In the present examples, a step for supplying a Pb source gas at 0.18 sccm for 20 seconds immediately after inserting a substrate was performed. The case where this step is not performed will now be described. After the temperature of a substrate was set at 360° C. and the substrate was transported into the deposition chamber, without supplying a Pb source gas, the atomic layer deposition step of a Ti source gas at 0.24 sccm for three seconds→deposition chamber evacuation for 10 seconds→the Pb source gas at 0.18 sccm for four seconds→deposition chamber evacuation for 10 seconds was repeated five times, preparing five layers of the PTO unit lattice. $NO_2$ gas was at 20 sccm in all steps. The same steps as those of the example were performed in the subsequent steps, and it was found that a pyrochlore phase was mixed in the resultant PZT thin film other than a perovskite phase. This indicates that when the atomic layer deposition as described in the present invention is performed, it is effective to start the deposition from the atomic layer of the element A1 (Pb in the case of the present examples) contained in A-site of $ABO_3$. In addition, it has been recognized that the deposition of the first Pb—O layer exerts no influence on the orientation control if it has a thickness of one atomic layer or more. However, if the first Pb—O layer presents in 30 atomic layers or more, the polarization properties starts to deteriorate, so that it is not practical.

Figure 4:
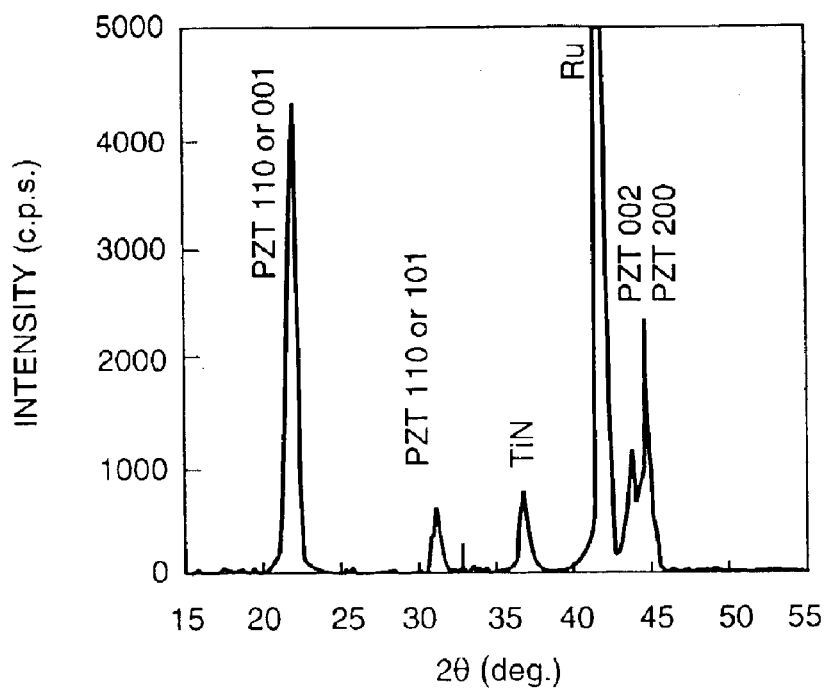
FIG. 4 illustrates, as comparative example 1 of the present invention, an X-ray diffraction spectrum of a PZT thin film in the case the atomic layer deposition has not been performed.

A comparative example will now be described, in which the atomic layer deposition has not been performed in the step of forming the early layer or early core in the example. In this comparative example, at first, the substrate temperature is set at 360° C., and the substrate is transported into the deposition chamber, followed by supplying a Pb source gas at 0.18 sccm for 20 seconds. Then, Pb and Ti source gases were simultaneously supplied at 0.18 sccm and 0.24 sccm respectively for 20 seconds to form an early layer or early core. Subsequently, the temperature of the substrate was raised to 460° C. in the deposition chamber, and then each of the source gases, Pb, Zr and Ti, was simultaneously supplied at 0.18 sccm, 0.15 sccm and 0.14 sccm respectively, depositing PZT to a thickness of 230 nm. $NO_2$ gas was supplied at 20 sccm in all steps similar to the example. X-ray diffraction spectrum of thus prepared PZT thin film is shown in FIG. 4. The intensity ratio of the peak intensity corresponding to (100) and (001) planes to the peak intensity corresponding to (110) or (101) plane was 8.7. Thus, it is apparent that (100) and (001) planes cannot be sufficiently oriented when the atomic layer deposition is not performed during the formation of the early layer or early core.

The case where the atomic layer deposition step is performed at 460° C., same as the PZT deposition temperature, will now be described. It was verified that the deposition of one atomic layer of a Pb-O layer and a Ti-O layer at 460° C. could be achieved by supplying a Pb source gas at 0.15 sccm for three seconds and a Ti source gas at 0.2 sccm for three seconds. At first, the substrate temperature was set at 460° C., and the substrate was transported into the deposition chamber, followed by supplying the Pb source gas at 0.18 sccm for 20 seconds. Then, the step of the Ti source gas at 0.2 sccm for three seconds→deposition chamber evacuation for 10 seconds→the Pb source gas at 0.15 sccm for three seconds→deposition chamber evacuation for 10 seconds was repeated five times. Subsequently, the temperature of the substrate was raised to 460° C. in the deposition chamber, and then each of the source gases, Pb, Zr and Ti, was simultaneously supplied at 0.18 sccm, 0.15 sccm and 0.14 sccm respectively, depositing PZT to a thickness of 230 nm. $NO_2$ gas was supplied at 20 sccm in all steps.

Figure 5:
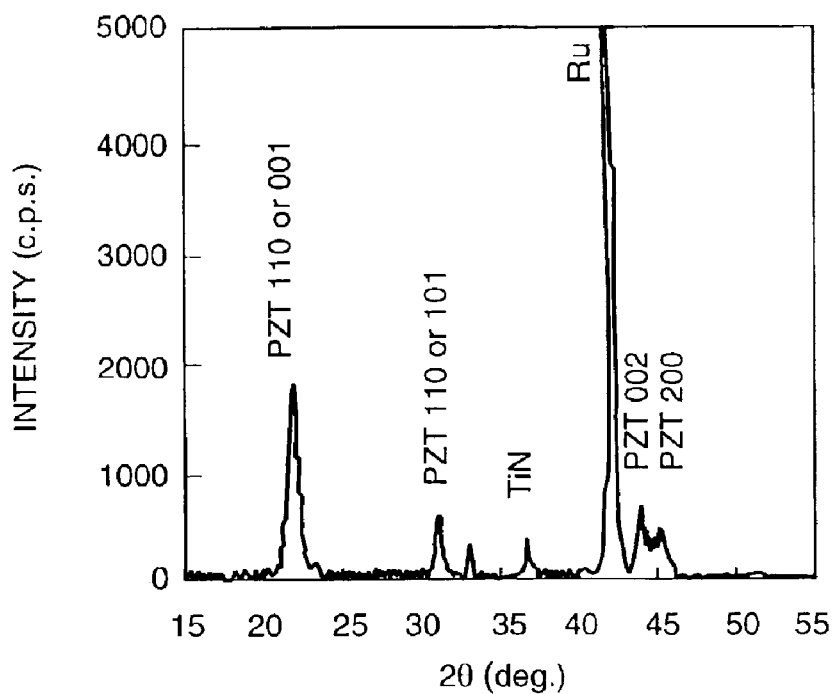
FIG. 5 illustrates, as comparative example 2 of the present invention, an X-ray diffraction spectrum of a PZT thin film in the case the atomic layer deposition has been performed at a high temperature according to the present invention.

The X-ray diffraction spectrum of thus prepared PZT thin film is shown in FIG. 5. The intensity ratio of the peak intensity corresponding to (100) and (001) planes to the peak intensity corresponding to (110) or (101) plane was 3.2. Thus, it is apparent that when the atomic layer deposition is performed at a temperature where the perovskite phase is crystallized during the formation of the early layer or early core, the (100) and (001) planes cannot be sufficiently oriented.

Figure 6:
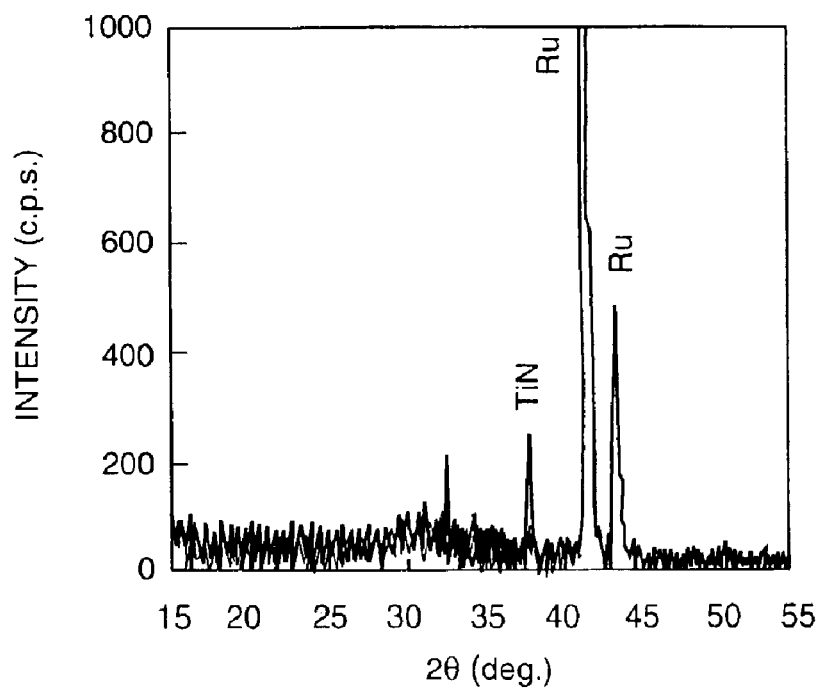
FIG. 6 illustrates an X-ray diffraction spectrum showing that the early layer or early core formed by the atomic layer deposition of the present invention is amorphous.

Further study on the temperature of performing the step of the atomic layer deposition revealed that a substrate temperature of preferably 400° C. or less, more preferably 380° C. or less was effective for the atomic layer deposition of PTO and that this temperature range corresponded to the temperature where the crystallization of the perovskite phase of PTO does not occur. FIG. 6 is an X-ray diffraction spectrum of PTO in which the atomic layer has been deposited at a deposition temperature of 380° C. The peak of PTO crystal was not observed, but only a broad peak that seems to be a substantially fully amorphous layer was observed. Note that the sample was prepared, similar to the example, by first supplying a Pb source gas at 0.18 sccm for 20 seconds, and then repeating the atomic layer deposition of supplying a Ti source gas at 0.24 sccm for three seconds and the Pb source gas at 0.18 sccm for four seconds, thereby depositing 100 atomic layers.

The above examples are described only for PZT as a perovskite oxide ferroelectric. However, the present invention is applicable to perovskite oxide ferroelectrics containing PZT as a main component, for example, a ferroelectric composition in which additives such as La, Ba, Ca, Nb, Ta, and Mn are incorporated in PZT, or to perovskite oxide ferroelectrics such as $BaTiO_3$ and $SrTiO_3$. In addition, although a polycrystalline Ru thin film was used for the upper most surface of the lower electrode in the above examples, similar results have been obtained by using a polycrystalline film of Ir or Pt which is a precious metal having a high melting point similar to Ru, a polycrystalline film of Ru or Ir having an oxygen-doped metal phase, and a polycrystalline film of a Ru oxide or an Ir oxide. Further, in terms of the nature of the present invention, as a method for preparing a perovskite oxide ferroelectric, deposition procedures capable of independently controlling the supply quantity of constitutional elements, for example, a physical vapor deposition method such as a multiple vacuum deposition method, a sputtering method and a laser ablation method can be used other than an MOCVD method.

In accordance with the present invention, the orientation of a perovskite oxide ferroelectric thin film can be arranged properly in (100) or (001) plane without remarkably increasing the deposition time. Variations between elements can be reduced when applied to fine elements. The reduction of the crystallization temperature can be achieved.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A vapor phase growth method of an oxide dielectric film for forming an oxide dielectric film having a perovskite crystal structure expressed by $ABO_3$ on a substrate, comprising:

a first step of sequentially and alternately supplying an A-site layer element material and a B-site layer element material to perform atomic layer deposition on said substrate to form an early layer or early core, at a first substrate temperature, and a second step of raising the temperature to a second substrate temperature that is higher than said first substrate temperature to crystallize the early layer or early core formed in said first step and simultaneously supplying both the A-site layer element material and the B-site layer element material to form an $ABO_3$ film.

2. The vapor phase growth method of an oxide dielectric film according to claim 1, wherein said oxide dielectric having a perovskite crystal structure expressed by $ABO_3$ is a ferroelectric comprising $Pb(Zr_xTi_{1-x})O_3$ (0<x<1) as a main component.

3. The vapor phase growth method of an oxide dielectric film according to claim 1, wherein said first substrate temperature is 400° C. or less.

4. The vapor phase growth method of an oxide dielectric film according to claim 1, wherein said substrate is a metal or a conductive oxide comprising at least one or more selected from Pt, Ir and Ru as a main component.

5. The vapor phase growth method of an oxide dielectric film according to claim 1, further comprising the step of supplying only the A-site layer element material in advance of said first step to form an A-site layer comprising layers composed of one or more atomic layers.

6. The vapor phase growth method of an oxide dielectric film according to claim 5, wherein said layers composed of one or more atomic layers is the layers composed of less than 30 atomic layers.

7. A vapor phase growth method of an oxide dielectric film for forming an $ABO_3$ film after forming an early layer or early core of $A1B1O_3$ by a major element A1 contained in A and a major element B1 contained in B, on a substrate, when forming an oxide dielectric film having a perovskite crystal structure expressed by $ABO_3$, comprising:

a first step of supplying an A1 source and an oxidant to prepare an A1 oxide layer, at a first substrate temperature where $A1B1O_3$ does not crystallize, a second step of supplying a B1 source and an oxidant to form one atomic layer of a B1 oxide on the A1 oxide layer, at the same substrate temperature as that in the first step, a third step of supplying an A1 source and an oxidant to form one atomic layer of an A1 oxide on said B1 oxide layer comprising one atomic layer, at the same substrate temperature as that in the first step, and a fourth step of subsequently raising the temperature to a second substrate temperature of 500° C. or less, thereby crystallizing the early layer or early core of $A1B1O_3$ formed in said first to third steps and then depositing an $ABO_3$ film.

8. The vapor phase growth method of an oxide dielectric film according to claim 7, wherein said second and third steps are repeated two or more times.

9. The vapor phase growth method of an oxide dielectric film according to claim 7, wherein said oxide dielectric having a perovskite crystal structure expressed by $ABO_3$ is a ferroelectric comprising $Pb(Zr_xTi_{1-x})O_3$ (0<x<1) as a main component and said $A1B1O_3$ is $PbTiO_3$.

10. The vapor phase growth method of an oxide dielectric film according to claim 7 wherein said first, second, third and fourth steps are performed by a MOCVD method using a metal organic material.

* * * * *